(12) United States Patent
Kitani et al.

(10) Patent No.: US 9,801,319 B2
(45) Date of Patent: Oct. 24, 2017

(54) TAPE FEEDER

(71) Applicant: PANASONIC INTELLECTUAL PROPERTY MANAGEMENT CO., LTD., Osaka (JP)

(72) Inventors: Minoru Kitani, Osaka (JP); Shigeru Matsukawa, Osaka (JP); Kazunori Kanai, Yamanashi (JP); Tatsuo Yamamura, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 412 days.

(21) Appl. No.: 14/643,256

(22) PCT Filed: Mar. 7, 2013

(86) PCT No.: PCT/JP2013/001453
§ 371 (c)(1),
(2) Date: Mar. 10, 2015

(87) PCT Pub. No.: WO2014/041712
PCT Pub. Date: Mar. 20, 2014

(65) Prior Publication Data
US 2015/0296669 A1  Oct. 15, 2015

(30) Foreign Application Priority Data
Sep. 11, 2012 (JP) ................. 2012-199151

(51) Int. Cl.
*H05K 13/00* (2006.01)
*H05K 13/04* (2006.01)
(Continued)

(52) U.S. Cl.
CPC ........... *H05K 13/0417* (2013.01); *B65H 5/28* (2013.01); *H05K 13/021* (2013.01)

(58) Field of Classification Search
CPC ..... H05K 13/0417; H05K 13/021; B65H 5/28
See application file for complete search history.

(56) References Cited

U.S. PATENT DOCUMENTS

2003/0219330 A1* 11/2003 Lyndaker ........... H05K 13/0417
                                                              414/411
2004/0039480 A1*  2/2004 Kou ..................... H05K 13/021
                                                              700/222
(Continued)

FOREIGN PATENT DOCUMENTS

CN       1711815 A       12/2005
JP    2005-104557 A    *  4/2005
(Continued)

OTHER PUBLICATIONS

Office Action issued in Chinese Patent Application No. 201380046286 dated Jun. 24, 2016.
(Continued)

*Primary Examiner* — Jeff Aftergut
(74) *Attorney, Agent, or Firm* — Pearne & Gordon LLP

(57) ABSTRACT

A second tape conveying mechanism 20B includes a sprocket 21B allowed to rotate freely only in a first rotating direction corresponding to a tape conveying direction, and a first urging member 30 which urges and causes a carrier tape 14 to engage the sprocket 21B. When a preceding tape 14(1) engages the sprocket 21B and a subsequent tape 14(2) is inserted, the second tape conveying mechanism 20B abuts against a leading end of the subsequent tape 14(2) to prohibit entry of the subsequent tape 14(2). After the preceding tape 14(2) passes a tape stopper 35a, a position of the second tape conveying mechanism 20B is changed from a tape entry prohibition position to a tape entry permission position.

3 Claims, 8 Drawing Sheets

(51) Int. Cl.
*H05K 13/02* (2006.01)
*B65H 5/28* (2006.01)

(56) References Cited

U.S. PATENT DOCUMENTS

| | | | | |
|---|---|---|---|---|
| 2004/0094451 | A1* | 5/2004 | Saho | B65H 19/1836 206/714 |
| 2010/0180435 | A1* | 7/2010 | Shin | B65H 37/002 29/740 |
| 2010/0290885 | A1* | 11/2010 | Kou | B65H 26/02 414/751.1 |
| 2011/0072654 | A1 | 3/2011 | Oyama et al. | |
| 2011/0243695 | A1 | 10/2011 | Hwang et al. | |

FOREIGN PATENT DOCUMENTS

| | | | |
|---|---|---|---|
| JP | 2011-77096 A | | 4/2011 |
| JP | 2011-171664 A | | 9/2011 |
| JP | 2011-211169 A | * | 10/2011 |
| JP | 2011-211169 A | | 10/2011 |

OTHER PUBLICATIONS

Search Report issued in Chinese Patent Application No. 201380046286 dated Jun. 24, 2016.
International Search Report for Application No. PCT/JP2013/001453 dated May 14, 2013.

* cited by examiner

UPSTREAM SIDE ← → DOWNSTREAM SIDE

TAPE FEEDER

TECHNICAL FIELD

The present invention relates to a tape feeder which supplies an electronic component held by a carrier tape to a component absorbing position of a component mounting mechanism.

BACKGROUND ART

A tape feeder is known as a device of supplying electronic components in a component mounting device. The tape feeder supplies electronic components to a component absorbing position of a mounting head of a component mounting mechanism by pitch-conveying a carrier tape which holds the electronic components. As a method of continuing the component supply in succession without stopping the mounting operation, in the tape feeder, a tape splicing method is traditionally used which connects a new subsequent carrier tape (subsequent tape) to the trailing end of a preceding carrier tape (preceding tape) which is already attached. In the tape splicing method, it is necessary for an operator to perform complicated operations each time a supply reel is to be exchanged, and it is desired to reduce the operation load. Therefore, a tape feeder is used to which a subsequent tape is set in a splicingless way without performing the tape splicing operation as a new tape supplementing method (for example, refer to Patent Document 1).

In the related art shown in Patent Document 1, at a tape insertion portion which is provided at the back end of the tape feeder, a tape conveying mechanism, which includes a sprocket which includes conveying pins which engage conveying holes of the carrier tape and an urging mechanism which includes a first urging mechanism and a second urging mechanism to urge the carrier tape to the sprocket, and which conveys the carrier tape by rotating the sprocket, is disposed. When the subsequent tape is to be supplied, the leading end of the subsequent tape is inserted between the preceding tape engaging the sprocket and the first urging mechanism, and entry of the subsequent tape is prohibited when the leading end of the subsequent tape abuts with the second urging mechanism. When the trailing end of the preceding tape passes the first urging mechanism, the subsequent tape engages the sprocket and can be conveyed to the downstream side.

RELATED ART DOCUMENTS

Patent Documents

Patent Document 1: JP-A-2011-211169

SUMMARY OF THE INVENTION

Problem to be Solved by the Invention

However, the thickness of a subsequent tape may be different from a preceding tape because of the variation in the thickness of carrier tapes even if the carrier tapes hold the same components. Therefore, in the above related art, there is the following problem. If the thickness of the subsequent tape is thicker than the thickness of the preceding tape, when the subsequent tape engages the sprocket and is tape conveyed to the downstream side, the leading end of the subsequent tape may be caught at the second urging mechanism, and a trouble occurs in the conveyance of the subsequent tape.

Thus, the object of the present invention is to provide a tape feeder so that with a splicingless method, even if the thickness of the preceding tape is different from that of the subsequent tape, the subsequent tape can be stably tape conveyed.

Means for Solving the Problem

According to the present invention, there is provided a tape feeder which is attached to a component mounting device and which supplies an electronic component to a component absorbing position of a mounting head, by pitch-conveying a carrier tape storing the electronic component in a tape conveying direction, the tape feeder including: a tape path which leads from a tape introducing port opened at an upstream end in the tape conveying direction to the component absorbing position, and which guides a tape conveyance of the carrier tape; a first tape conveying mechanism which is provided at a downstream side of the tape path, and which pitch-conveys the carrier tape to the component absorbing position; and a second tape conveying mechanism which is provided at an upstream side of the tape path, and which conveys the carrier tape introduced from the tape introducing port toward the downstream side, wherein the second tape conveying mechanism includes: a sprocket which conveys the carrier tape by rotating in a state in which the sprocket engages the carrier tape fitting a plurality of conveying pins provided at an outer periphery of the sprocket into conveying holes of the carrier tape; a first urging mechanism which allows an abutting surface of an urging member to contact the carrier tape and presses the carrier tape to urge the carrier tape to from a surface opposite to a component storing surface to the outer periphery of the sprocket, whereby the conveying pins engage the conveying holes; and a tape stopper which, when a preceding tape to be carried precedingly of two carrier tapes to be carried precedingly and subsequently conveyed engages the sprocket and a subsequent tape to be subsequently carried is inserted between the sprocket and the preceding tape, abuts against a leading end of the subsequent tape to prohibit entry of the subsequent tape, and wherein after a trailing end of the preceding tape passes the tape stopper, a position of the tape stopper is changed from a tape entry prohibition position at which the entry of the subsequent tape is prohibited to a tape entry permission position at which the entry of the subsequent tape is permitted.

Advantages of the Invention

According to the present invention, the second tape conveying mechanism conveys the carrier tape introduced from the tape introducing port of the tape path toward the downstream side. The second tape conveying mechanism includes the sprocket which rotates to convey the carrier tape while engaging the carrier tape, the first urging mechanism which urges the carrier tape to the outer periphery of the sprocket to cause the carrier tape to engage the sprocket, and the tape stopper which when a preceding tape to be conveyed precedingly of two carrier tapes to be carried precedingly and subsequently conveyed engages the sprocket and the subsequent tape is inserted between the sprocket and the preceding tape, abuts against a leading end of the subsequent tape to prohibit entry of the subsequent tape. After the trailing end of the preceding tape passes the tape stopper, the position of the tape stopper is changed from the tape entry prohibition position to the tape entry permission position. Therefore, with the splicingless method, even if the thickness of the preceding tape is different from that of the subsequent tape, the subsequent carrier tape can be stably set.

MODE FOR CARRYING OUT THE INVENTION

Next, the embodiment of the present invention is described with reference to the figures. First, the construction of the component mounting device 1 which mounts electronic components on boards is described with reference to FIGS. 1 and 2. The component mounting device 1 has a function of mounting electronic components such as semiconductor chips on boards, and FIG. 2 partially shows an A-A section in FIG. 1.

Figure 1:
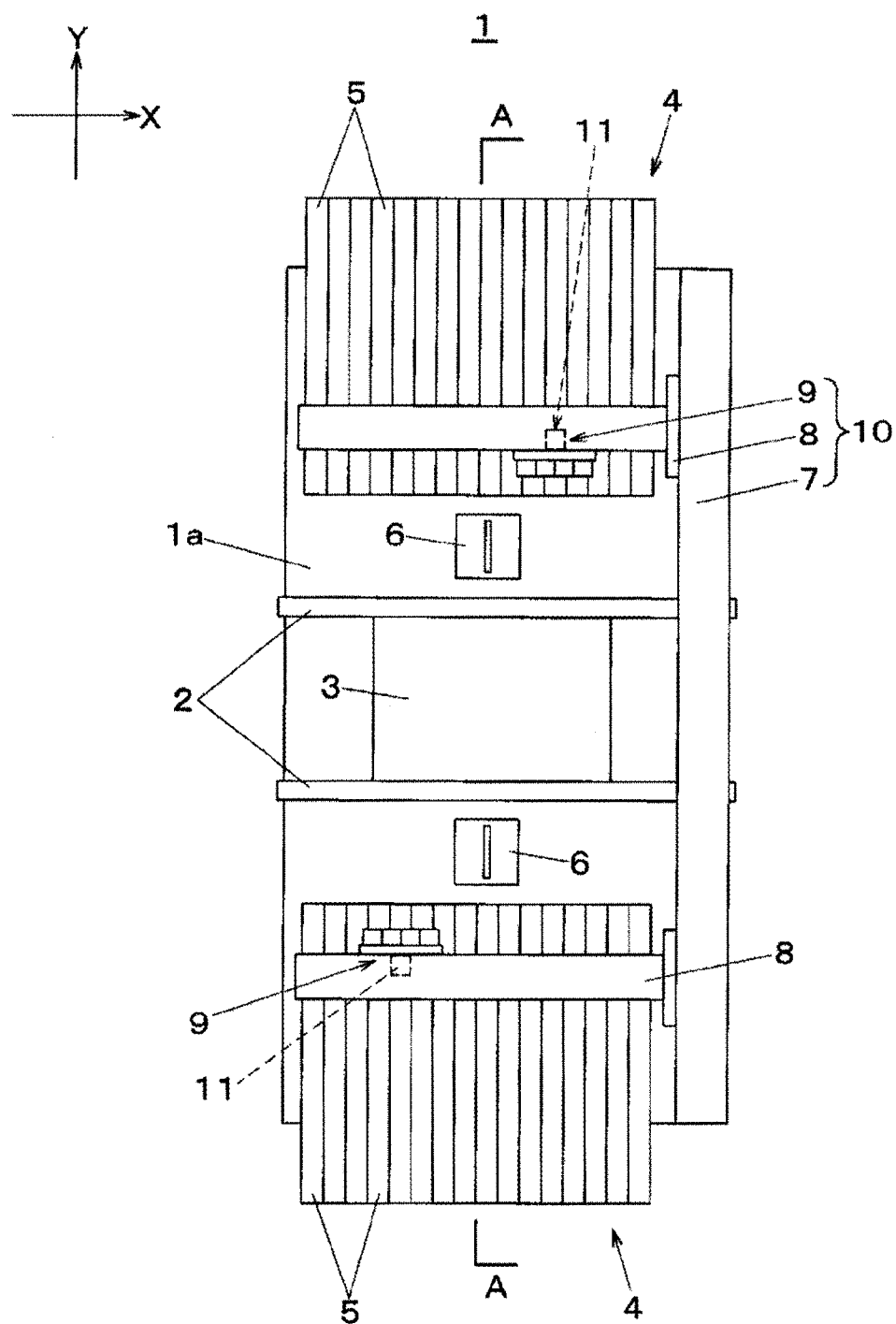
FIG. 1 is a top view of a component mounting device according to an embodiment of the present invention.

In FIG. 1, a board conveying mechanism 2 is disposed at the center of a base 1a in the X direction (board conveying direction). The board conveying mechanism 2 conveys a board 3 which is introduced from upstream, and positions and holds the board 3 to a mounting stage which is set to perform component mounting operations. Component supply units 4 are arranged respectively at two sides of the board conveying mechanism 2, and a plurality of tape feeders 5 are attached in parallel with each other to each of the component supply units 4. The tape feeder 5 supplies an electronic component to a component absorbing position of a mounting head of a component mounting mechanism to be described below by pitch-conveying a carrier tape which stores the electronic component in a tape conveying direction, namely, a direction from the outside of the component supply unit 4 toward the board conveying mechanism 2.

A Y axis movable table 7, which is provided with a linear driving mechanism, is disposed at one end in the X direction on the top surface of the base 1a, and two X axis movable tables 8, which are provided with linear driving mechanisms similarly, are coupled to the Y axis movable table 7 movably in the Y direction. Mounting heads 9 are attached to the two X axis movable tables 8 movably in the X direction, respectively. The mounting head 9 is a multiple-pieces-connected type one which is provided with a plurality of holding heads, and as shown in FIG. 2, an absorbing nozzle 9a, which absorbs and holds an electronic component and may be moved up and down individually, is provided on the lower end of each of the holding heads.

By driving the Y axis movable table 7 and the X axis movable table 8, the mounting head 9 is moved in the X direction and Y direction. Therefore, the two mounting heads 9 take out the electronic components from the component absorbing positions of the tape feeders 5 of the corresponding component supply units 4 with the absorbing nozzles 9a, and transfer them to a mounting position of the board 3 which is positioned by the board conveying mechanism 2. The Y axis movable table 7, the X axis movable table 8, and the mounting head 9 constitute a component mounting mechanism 10 which transfers electronic components to the board 3 by moving the mounting head 9 which holds the electronic components.

Component recognizing cameras 6 are disposed between the component supply units 4 and the board conveying mechanism 2. The component recognizing camera 6 images and recognizes an electronic component which is held by the mounting head 9 when the mounting head 9, which took out the electronic component from the component supply unit 4, is moved above the component recognizing camera 6. A board recognizing camera 11 which is located under the X axis movable table 8 and is moved integrally with the corresponding mounting head 9 is provided in the mounting head 9. When the mounting head 9 is moved, the board recognizing camera 11 is moved above the board 3 which is positioned by the board conveying mechanism 2, and images and recognizes the board 3. When a component is mounted to the board 3 by the mounting head 9, the result of recognizing the electronic component from the component recognizing camera 6 and the board recognition result from the board recognizing camera 11 are considered to correct the loading position.

Figure 2:
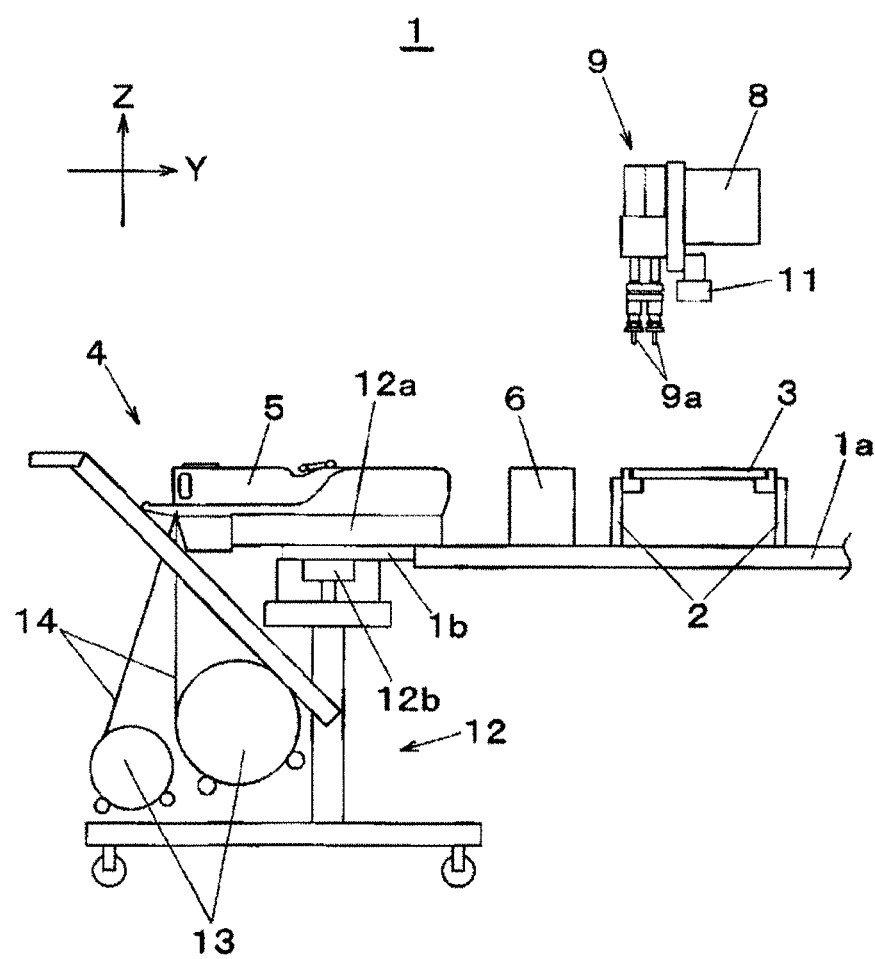
FIG. 2 is a partial sectional view of the component mounting device according to the embodiment of the present invention.

As shown in FIG. 2, a carriage 12 in which a plurality of tape feeders 5 are attached to a feeder base 12a in advance is set in the component supply unit 4. The position of the carriage 12 in the component supply unit 4 is fixed when the feeder base 12a is clamped to a fixed base 1b, which the base 1a is provided with, by a clamping mechanism 12b. Supply reels 13 which receive carrier tapes 14 which hold electronic components by winding the carrier tapes 14 are held in the carriage 12. The carrier tapes 14 drawn out from the supply reel 13s are pitch-conveyed by the tape feeders 5 to the component absorbing positions of the absorbing nozzles 9a.

Figure 3:
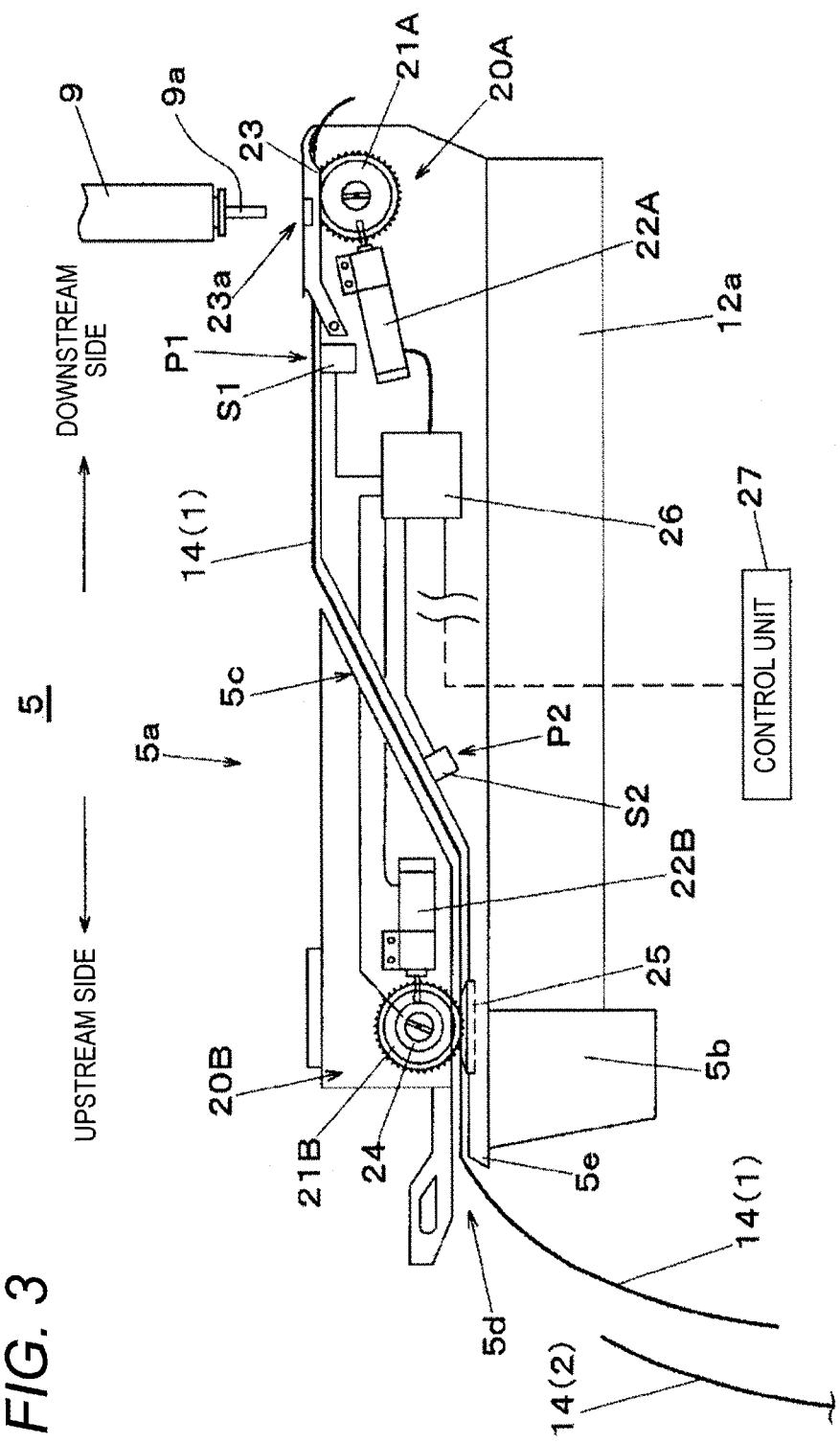
FIG. 3 is an illustrative figure of the construction of a tape feeder according to the embodiment of the present invention.

Next, a structure and functions of the tape feeder 5 are described with reference to FIG. 3. As shown in FIG. 3, the tape feeder 5 includes a body portion 5a and an attaching portion 5b which protrudes downward from the bottom surface of the body portion 5a. In a state in which the tape feeder 5 is attached such that the bottom surface of the body portion 5a is placed along the feeder base 12a, a connector (not shown in the figure) provided in the attaching portion 5b is fitted with the tape base 12a. Thereby, while the tape feeder 5 is fixed and attached to the component supply unit 4, and a built-in tape conveying control unit 26 which is provided to control a tape conveyance in the tape feeder 5 is electrically connected to a control unit 27 of the component mounting device 1.

A tape path 5c which guides the carrier tape 14 which is drawn out from the supply reel 13 and taken into the body portion 5a is provided inside the body portion 5a. The tape path 5c is provided to communicate a tape introducing port 5d which is opened between an extending portion 5e, which is formed by extending the lower end of the body portion 5a to the upstream side, and the upstream end of the body portion 5a with the component absorbing position where the electronic component is taken out by the mounting head 9. In the process of performing the component mounting operation continually, a plurality of carrier tapes 14 (what is stored in one supply reel 13 is assumed as a unit lot) are inserted sequentially from the tape introducing port 5d and are supplied to the tape feeder 5.

In the component mounting device 1 shown in the present embodiment, a splicingless method is used in which without tape splicing the trailing end of a carrier tape 14(1) which is already attached to the tape feeder 5 (referred to as "preceding tape 14(1)" hereinafter) and the leading end of a carrier tape 14(2) which is newly attached when components run out (referred to as "subsequent tape 14(2)" hereinafter) by a bonding tape, while the preceding tape 14(1) and the subsequent tape 14(2) are separated, the preceding tape 14(1) and the subsequent tape 14(2) are sequentially inserted to the tape introducing port 5d and supplied.

A first tape conveying mechanism 20A and a second tape conveying mechanism 20B are disposed at the downstream and upstream sides in the tape path 5c, respectively. The first tape conveying mechanism 20A and the second tape conveying mechanism 20B is so constructed that sprockets 21A and 21B are rotated by motors 22A and 22B respectively. The carrier tape 14 is conveyed by rotating the sprockets 21A and 21B while a plurality of conveying pins 21a (refer to FIG. 4(a)), which are provided on the outside peripheries of the sprockets 21A and 21B, are fitted into conveying holes 14a (refer to FIG. 6(a)) of the carrier tape 14 such that the sprockets 21A and 21B engage the carrier tape 14.

The first tape conveying mechanism 20A, which is provided at the downstream side of the tape path 5c, pitch-conveys the carrier tape 14 to the component absorbing position of the mounting head 9. A tape pressing member 23 is disposed above the first tape conveying mechanism 20A, and the carrier tape 14 which is pitch-conveyed by the first tape conveying mechanism 20A is guided by being pressed from above by the tape pressing member 23. The electronic component held by the carrier tape 14 is taken out by the absorbing nozzle 9a of the mounting head 9 through an opening portion 23a which is formed in the tape pressing member 23 in accordance with the component absorbing position.

The second tape conveying mechanism 20B, which is provided at the upstream side of tape path 5c, has a function of conveying the carrier tape 14 which is led from the tape introducing port 5d to the downstream side. The second tape conveying mechanism 20B is provided with an urging mechanism 25, which not only has a function of urging to cause the carrier tape 14 to engage the sprocket 21B, but also has a stopper function of switching between tape conveyance prohibited and permitted states when the carrier tape 14 is additionally supplied, under the sprocket 21B at the extending portion 5e.

A first detecting position P1 where the carrier tape 14 is detected is set as a position near the component absorbing position which is at the upstream side of the first tape conveying mechanism 20A in the tape path 5c, and a second detecting position P2 where the carrier tape 14 is similarly detected is set at the downstream side of the second tape conveying mechanism 20B and at the upstream side of the first detecting position P1. A first tape detection sensor S1 and a second tape detection sensor S2, which are disposed at the first detecting position P1 and the second detecting position P2 respectively, detect whether there are carrier tapes 14 at the first detecting position P1 and the second detecting position P2. The detection results from the first tape detection sensor S1 and the second tape detection sensor S2 are transmitted to the tape conveying control unit 26, and the tape conveying control unit 26 controls the rotation of the motors 22A and 22B and controls a clutch mechanism 24 included in the second tape conveying mechanism 20B to be described below based on those detection results.

In this embodiment, the trailing ends E and the leading ends T of the preceding tape 14(1) which is conveyed precedingly and the subsequent tape 14(2) which is conveyed subsequently, which are two carrier tapes conveyed in tandem, are detected respectively by the first tape detection sensor S1 and the second detection sensor S2. The tape conveying control unit 26 controls an interval between the trailing end E and the leading end T in the tape path 5c with an interval control pattern which is set beforehand by controlling the first tape conveying mechanism 20A and the second tape conveying mechanism 20B based on the results of detecting the trailing end E and the leading end T from the first tape detection sensor S1 and the second tape detection sensor S2.

Figure 4A:
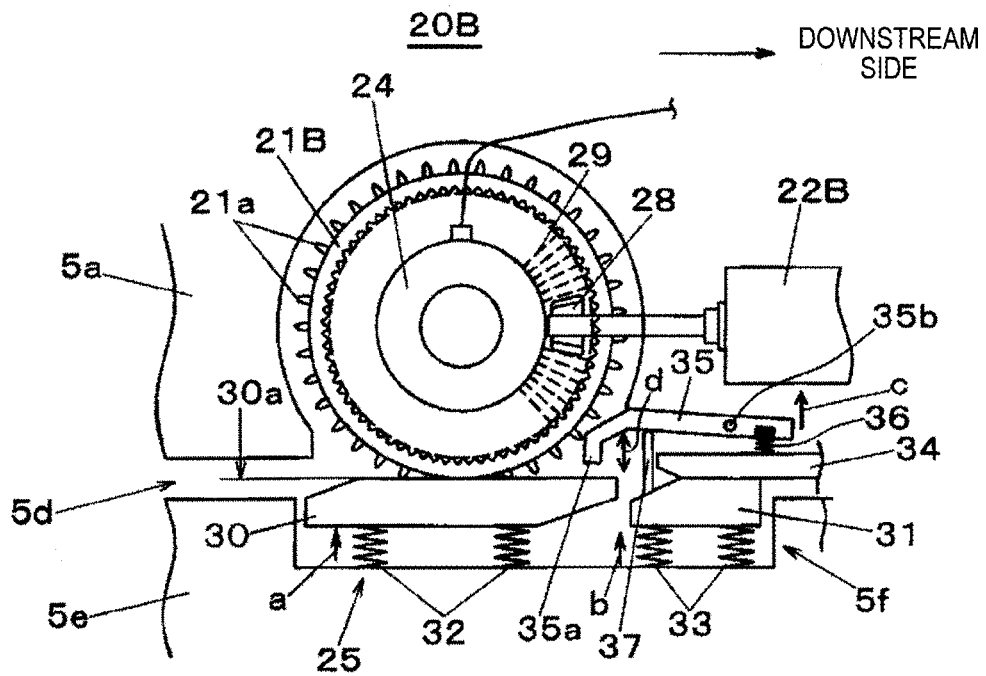
FIGS. 4(a), 4(b) and 4(c) are illustrative figures of the construction and function of a second tape conveying mechanism in the tape feeder according to the embodiment of the present invention.

Next, with reference to FIGS. 4(a) to 4(c), 5(a) to 5(c) and 6(a) to 6(c), the construction of the second tape conveying mechanism 20B and the function of the urging mechanism 25 are described. As shown in FIG. 4(a), the sprocket 21B is coupled to a connecting gear 29 through the clutch mechanism 24, and the sprocket 21B is rotated in the tape conveying direction when a bevel gear 28 which engages the connecting gear 29 is rotated by the motor 22B. Here, the function of the clutch mechanism 24 is described. A one-way clutch mechanism which allows free rotation only in a first rotating direction corresponding to the tape conveying direction from upstream to downstream and prohibits free rotation in the opposite direction, and a disengaging mechanism which disengages the sprocket 21B from the connecting gear 29 to stop the drive transmission are built in the clutch mechanism 24.

Figure 5A:
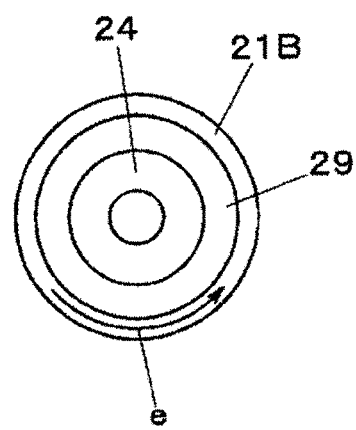
FIGS. 5(a), 5(b) and 5(c) are illustrative figures of the function of a rotation driving unit, which the second tape conveying mechanism of the tape feeder is provided with, according to the embodiment of the present invention.
Figure 5B:
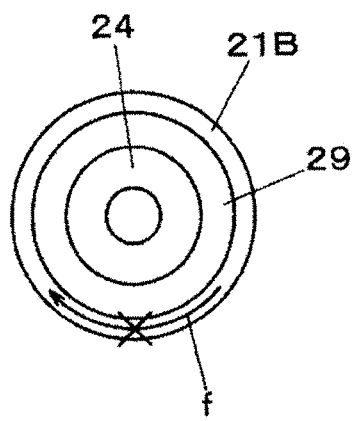
Figure 5C:
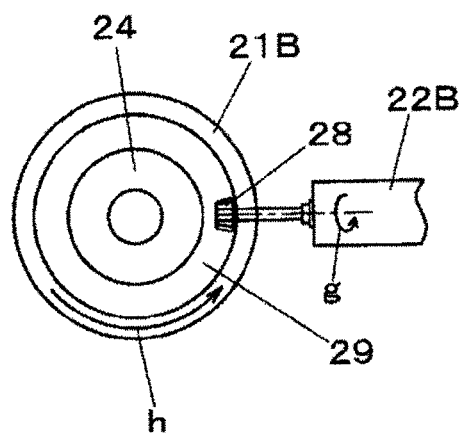

That is, as shown in FIG. 5(a), the free rotation of the sprocket 21B in an arrow e direction (counterclockwise direction) which is the first rotating direction is allowed, and as shown in FIG. 5(b), the free rotation of the sprocket 21B in an arrow f direction (clockwise direction) is prohibited. As shown in FIG. 5(c), by driving the motor 22B to rotate the bevel gear 28 in an arrow g direction, the sprocket 21B is rotated in the first rotating direction (arrow h direction) corresponding to the tape conveying direction.

That is, the motor 22B, the connecting gear 29 and the clutch mechanism 24 constitute a rotation driving unit which is operated switchably between two operating modes including a free rotation mode which allows free rotation of the sprocket 21B in the first rotating direction and a driving mode in which the sprocket 21B is rotated in the first rotating direction. When the motor 22B and the clutch mechanism 24 are controlled by the tape conveying control unit 26, the free rotation mode shown in FIG. 5(a) and the driving mode shown in FIG. 5(c) are switched.

The urging mechanism 25 is disposed below the sprocket 21B. The urging mechanism 25 includes a first urging member 30 and a second urging member 31, which are provided in a recess portion 5f formed by partially cutting the extending portion 5e. The first urging member 30 is urged upward by compression springs 32, and the second urging member 31 is provide in the vicinity of and at the downstream side of the first urging member 30, and urged upward by compression springs 33.

The first urging member 30 mainly includes a block member which has a substantially parallelogram shape and in which the upstream end at the top surface and the downstream end at the bottom surface are taper cut, respectively. When the carrier tape 14 is inserted between the first urging member 30 and the sprocket 21B through the tape introducing port 5d, an abutting surface 30a of the first urging member 30, which is urged upward (arrow a) by the compression springs 32, abuts against the bottom surface (the surface opposite to the components storing surface) of the carrier tape 14 to urge upward the carrier tape 14 so that the carrier tape 14 is pressed to the outer periphery of the sprocket 21B.

Therefore, the conveying pins 21a are fitted in the conveying holes 14a of the carrier tape 14, and the carrier tape 14 engages the sprocket 21B. Namely, the first urging member 30 and the compression springs 32 serve as a first urging mechanism which makes the abutting surface 30a of the first urging member abut against and press the bottom surface of the carrier tape 14 to urge the carrier tape 14 to the outer periphery of the sprocket 21B from the surface opposite to the components storing surface, to cause the sprocket 21B to engage the carrier tape 14.

The second urging member 31 mainly includes a block member which has a substantially rectangular shape and in which the upstream end at the top surface is taper cut, and is urged upward (an arrow b) by the compression springs 33. A guide member 34 is horizontally placed above the second urging member 31, and when the carrier tape 14 is not set, the top surface of the second urging member 31 abuts against the bottom surface 34a of the guide member 34. When the carrier tape 14 which is inserted between the first urging member 30 and the sprocket 21B is conveyed to the second urging member 31, the second urging member 31 is urged from below by the compression springs 33 so that the carrier tape 14 is held between the second urging member 31 and the guide member 34 (refer to FIG. 4(c)).

A stopper unit 35, which has a function of switching between prohibiting and permitting the tape conveyance of the carrier tape 14, is disposed above the guide member 34. The stopper unit 35 is pivotally supported by a shaft supporting portion 35b, which is horizontally placed, in a direction which is perpendicular to the tape conveying direction, and the upstream end of the stopper unit 35 extends to above the downstream end of the first urging member 30 which is set at a tape stop position, to become a tape stopper 35a which is bent downward. The downstream end of the stopper unit 35 is urged upward (arrow c) by a compression spring 36, and the tape stopper 35a is always urged downward to the first urging member 30.

A lifting member 37 which extends upward is implanted in the second urging member 31, and the lifting member 37 abuts against the bottom surface of the stopper unit 35 at a position upstream from the shaft supporting portion 35b. When the second urging member 31 is lifted by the compression springs 33, the lifting member 37 is moved with the second urging member 31 to be moved upward, and the part of the lifting member 37 that abuts against the stopper unit 35 is lifted from below. Thereby, the tape stopper 35a is lifted upward from the tape stop position at the downstream end of the first urging member 30. When the second urging member 31 drops, as the lifting member 37 is moved with the second urging member 31, the lifting member 37 drops, and thereby the tape stopper 35a drops to the tape stop position of the first urging member 30. That is, with upward/downward movements of the second urging member 31, the tape stopper 35a is moved upward/downward (arrow d) from/to the tape stop position.

Figure 4B:
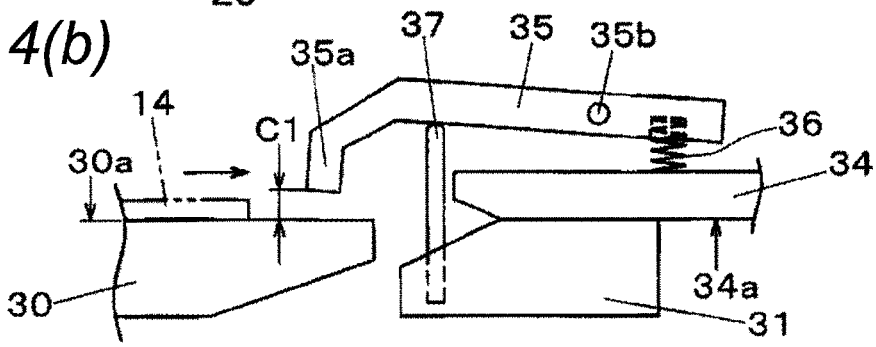

As shown in FIG. 4(b), when the second urging member 31 abuts against the bottom surface 34a of the guide member 34, the tape stopper 35a is at a high position (tape entry permission position) which is separated from the abutting surface 30a of the first urging member 30 by a clearance C1 which does not prevent the carrier tape 14 from passing, and in this state the carrier tape 14 which is conveyed by the sprocket 21B is permitted to enter the second urging member 31 from the first urging member 30.

Figure 4C:
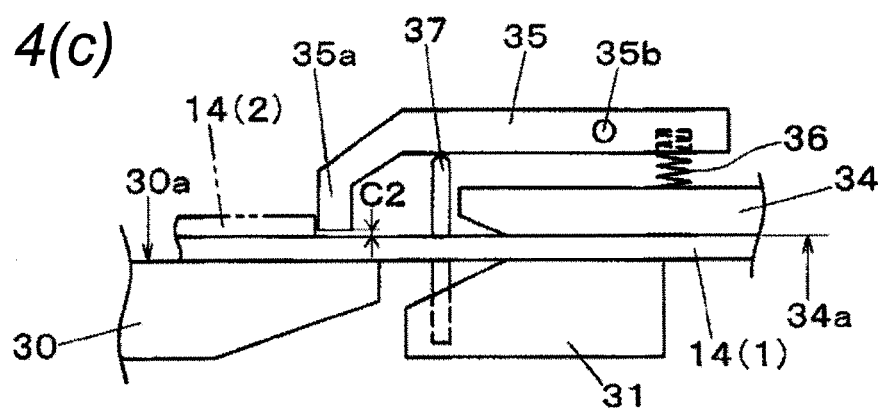

As shown in FIG. 4(c), when the preceding tape 14(1) is held between the second urging member 31 and the guide member 34, the tape stopper 35a drops by a distance corresponding to the thickness of the preceding tape 14(1) in comparison with the state shown in FIG. 4(b). Therefore, the tape stopper 35a is at a high position (a position at which entry of the tape is prohibited) which is separated from the top surface of the preceding tape 14(1) by a clearance C2 which prevents the carrier tape 14 from passing. In this state, the head end of the subsequent tape 14(2) conveyed by the sprocket 21B abuts against the tape stopper 35a, and the movement of the subsequent tape 14(2) from the first urging member 30 to the second urging member 31 is prohibited.

That is, while, in the two carrier tapes 14 conveyed in tandem, the preceding tape 14(1) conveyed precedingly engages the sprocket 21B, and the subsequent tape 14(2) conveyed subsequently is inserted between the sprocket 21B and the preceding tape 14(1), the tape stopper 35a abuts against the leading end of the subsequent tape 14(2) to prohibit entry of the subsequent tape 14(2).

In the above construction, the second urging member 31 and the compression springs 33 are provided downstream in the tape conveying direction from the tape stopper 35a, and serve as a second urging mechanism which urges from below to hold the preceding tape 14(1). When the tape stopper 35a is lifted by the lifting member 37 when the second urging mechanism rises, the position of the tape stopper 35a is changed from the tape entry prohibition position where the subsequent tape 14(2) is prohibited from entering to the tape entry permission position where the subsequent tape 14(2) is permitted to enter.

That is, the position of the tape stopper 35a is changed from the tape entry prohibition position, where the entry of the subsequent tape 14(2) is prohibited as shown in FIG. 4(c), to the tape entry permission position, where the entry of the subsequent tape 14(2) is permitted as shown in FIG. 4(b), after the trailing end of the preceding tape 14(1) passes the tape stopper 35a and passes the second urging member 31. In detail, when the second urging member 31 rises after the trailing end of the preceding tape 14(1) passes the second urging member 31, the position of the tape stopper 35a is changed to the tape entry permission position from the tape entry prohibition position because the tape stopper 35 is moved together with the second urging member 31.

At this time, it is possible to set the clearances C1 and C2 shown in FIGS. 4(b) and 4(c) to desired sizes by setting the size and disposing position of the stopper unit 35. Therefore, even when the thickness of the preceding tape 14(1) is somewhat different from the thickness of the subsequent tape 14(2) because of the variation of the tape thickness, it is possible that the preceding tape 14(1) passes the tape stopper 35a and the second urging member 31 without any interference while the subsequent tape 14(2) is surely stopped.

Figure 6A:
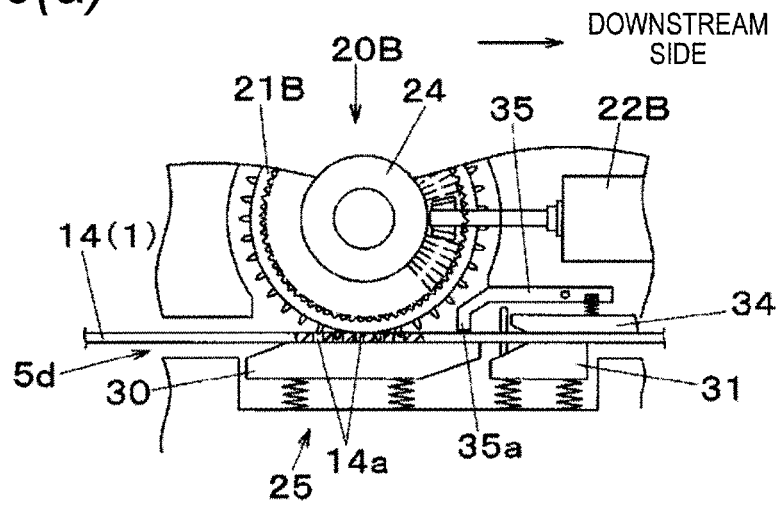
FIGS. 6(a), 6(b) and 6(c) are illustrative figures of actions of the tape feeder when a tape setting method is performed according to the embodiment of the present invention.
Figure 6B:
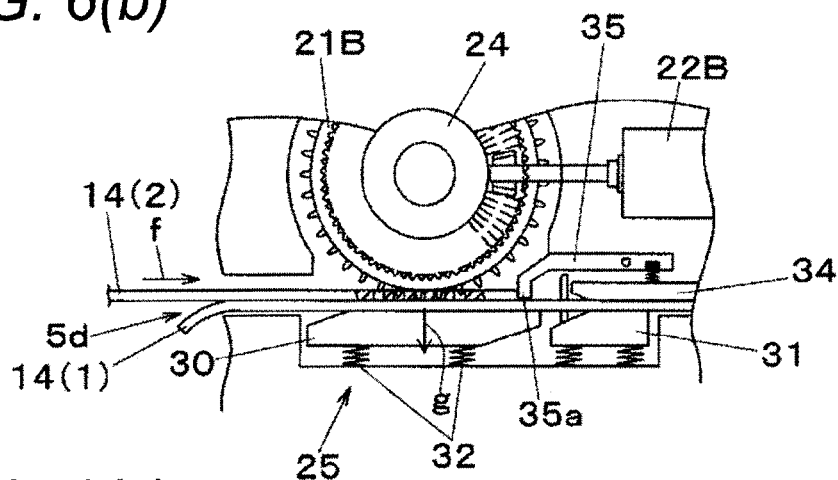
Figure 6C:
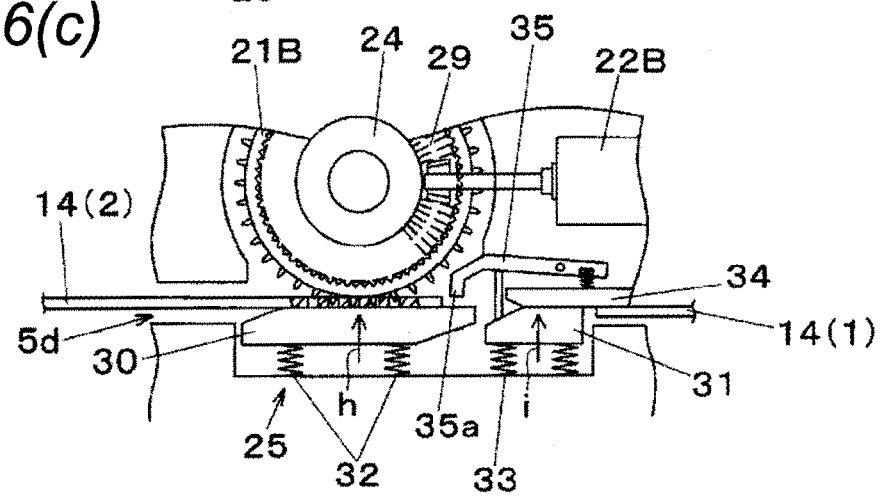

With reference to FIGS. 6(a) to 6(c), a tape setting method to set the carrier tape 14 to the tape feeder 5 is described next. In the process of performing the component mounting operation in which electronic components are continually supplied to the component mounting mechanism 10 by the tape feeder 5, without tape splicing the preceding tape 14(1) conveyed precedingly and the subsequent tape 14(2) conveyed subsequently which are two carrier tapes 14 conveyed in tandem, the subsequent tape 14(2) is supplied to the tape feeder 5 while the preceding tape 14(1) engages the sprocket 21B.

First, FIG. 6(a) shows that the preceding tape 14(1) which is conveyed precedingly is tape conveyed while the preceding tape 14(1) engages the sprocket 21B, and components are continually supplied by the preceding tape 14(1). At this time, the first urging member 30 pushes the preceding tape 14(1) up to the sprocket 21B from below, and the second urging member 31 is in such a state that the preceding tape 14(1) is sandwiched between the guide member 34 and the second urging member 31. At this time, the tape stopper 35a is at the tape entry permission position shown in FIG. 4(c), and the preceding tape 14(1) is conveyed from the first urging member 30 to the second urging member 31 without being blocked by the tape stopper 35a. In this state, the free rotation in the tape conveying direction of the sprocket 21B is permitted by switching the clutch mechanism 24, and the preceding tape 14(1) is conveyed freely by the first tape conveying mechanism 20A regardless of the second tape conveying mechanism 20B.

Next, when the trailing end of the preceding tape 14(1) approaches the tape introducing port 5d while the components are continually supplied, the subsequent tape 14(2) is added and set. That is, as shown in FIG. 6(b), the leading end of the subsequent tape 14(2) which is conveyed subsequently is inserted (arrow f) between the sprocket 21B and the preceding tape 14(1). At this time, the first urging member 30 is pushed downward (arrow g) against the urging force of the compression springs 32 by the thickness of the subsequent tape 14(2). At this time, because the height position of the second urging member 31 is at the tape entry prohibition position shown in FIG. 4(c), the leading end of the subsequent tape 14(2) abuts against the tape stopper 35a, and the tape conveyance to the downstream side is prohibited. In this state, the free rotation in the tape conveying direction of the sprocket 21B is also permitted similarly, the preceding tape 14(1) is conveyed freely by the first tape conveying mechanism 20A, and the subsequent tape 14(2) is in such a stop state that the leading end of the subsequent tape (2) abuts against the tape stopper 35a.

In this state, when the tape conveyance of the preceding tape 14(1) goes on, the preceding tape 14(1), which is urged by the first urging mechanism including the compression springs 32 and the first urging member 30, leaves for the downstream side from a state of being held between the sprocket 21B and the subsequent tape 14(2) which is pushed to and engages the sprocket 21B, and further leaves from a state of being held between the second urging member 31 and the guide member 34.

Thereby, as shown in FIG. 6(c), both of the first urging member 30 urged upward by the compression springs 32 and the second urging member 31 urged upward by the compression springs 33 are lifted upward by the thickness of the preceding tape 14(1), and the subsequent tape completely engages the sprocket 21B. The tape stopper 35a is moved with the second urging member 31 which rises, and is changed to the tape entry permission position as shown in FIG. 4(b). Thereby, it becomes possible to conveying the subsequent tape 14(2) to the downstream side. At this time, because the sprocket 21B is permitted to idly rotate only in the first rotating direction corresponding to the tape conveying direction and is prohibited to rotate in the opposite direction, the subsequent tape 14(2) is prevented from falling off to the upstream side.

Figure 7A:
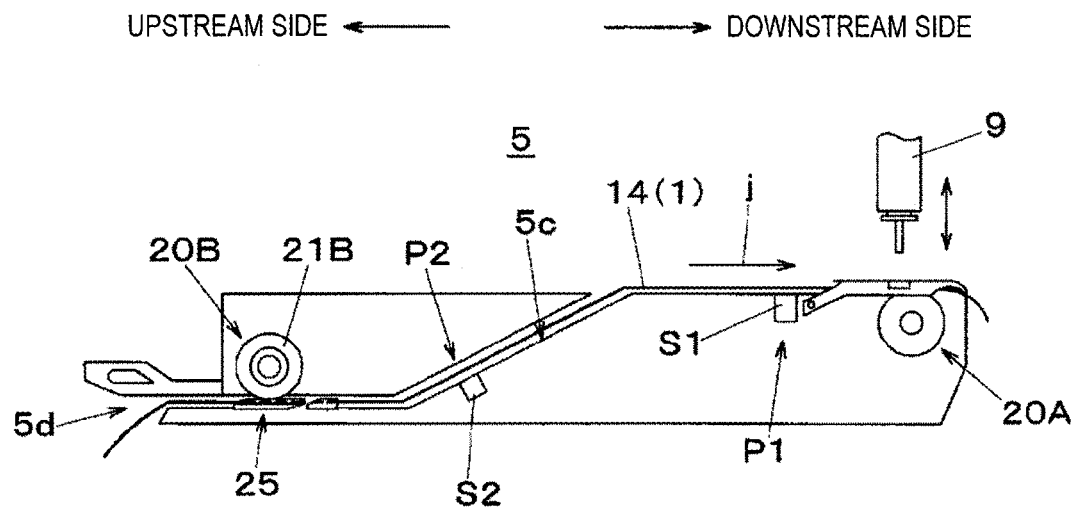
FIGS. 7(a), 7(b) and 7(c) are illustrative figures of steps of a tape conveying method which is performed by the tape feeder according to the embodiment of the present invention.
Figure 7B:
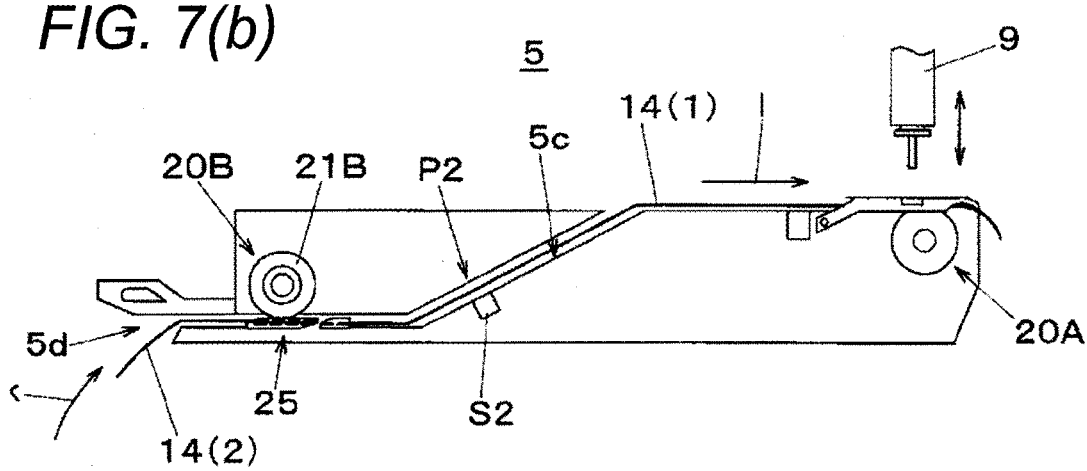
Figure 7C:
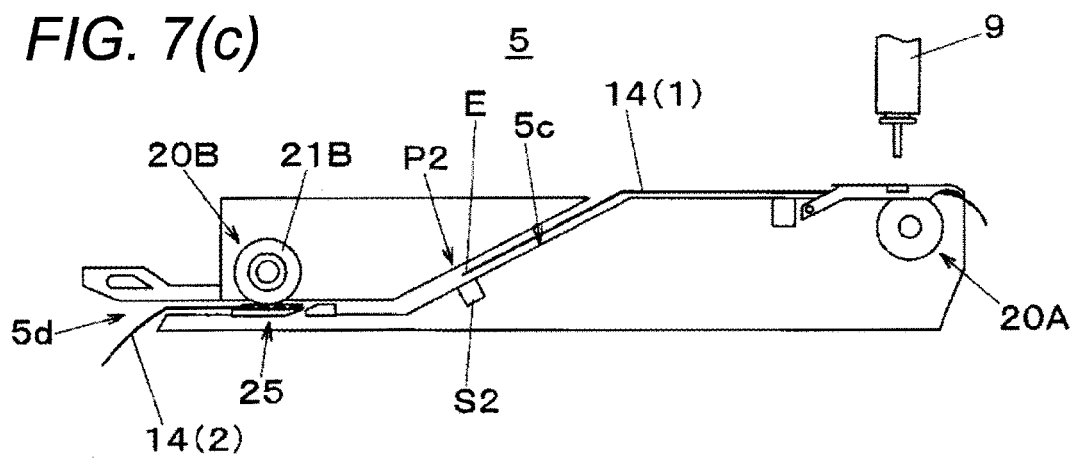

After that, the preceding tape 14(1) is conveyed by the first tape conveying mechanism 20A, and when the trailing end E of the preceding tape 14(1) is detected by the second tape detection sensor S2 (refer to FIG. 7(c)) which is disposed at the second detecting position P2, the clutch mechanism 24 is switched by the tape conveying control unit 26. That is, the operation mode of the rotation driving unit including the motor 22B, the connecting gear 29 and the clutch mechanism 24 is switched from the free rotation mode to the driving mode. Thereby, the sprocket 21B is driven to rotate in the first rotating direction corresponding to the tape conveying direction by the motor 22B, and the subsequent tape 14(2) is conveyed.

Then, with reference to FIGS. 7(a) to 7(c), and 8(a) to 8(c), a method of sequentially conveying a plurality of carrier tapes 14 in the tape feeder 5 is described. FIGS. 7(a) to 7(c) and FIGS. 8(a) to 8(c) show a procedure of sequentially conveying the preceding tape 14(1) which is conveyed precedingly and the subsequent tape 14(2) which is conveyed subsequently, which are two carrier tapes 14 conveyed in tandem, along the tape path 5c.

First, FIG. 7(a) shows that the component mounting operation is performed while the preceding tape 14(1) is tape conveyed along the tape path 5c. That is, the preceding tape 14(1) is introduced to the tape feeder 5 through the tape introducing port 5d, and is tape conveyed by the first tape conveying mechanism 20A so that the electronic component is taken out from the preceding tape 14(1) by the mounting head 9 at the component absorbing position.

Then, as shown in FIG. 7(b), in the process of performing the component mounting operation continually, when the component supply from the preceding tape 14(1) nearly ends, the subsequent tape 14(2) is added and set to replenish components. That is, while the preceding tape 14(1) engages the sprockets 21B of the second tape conveying mechanism 20B, the leading end of the subsequent tape 14(2) is introduced from the tape introducing port 5d (arrow k), and inserted between the sprocket 21B and the preceding tape 14(1) so that the subsequent tape 14(2) engages the sprocket 21B (refer to FIG. 6(b)). In this state, the preceding tape 14(1) is continually tape conveyed by the first tape conveying mechanism 20A, and the electronic components are continually taken out by the mounting head 9.

Then, in the process of conveying the preceding tape 14(1), as shown in FIG. 7(c), the trailing end E of the preceding tape 14(1) is detected by the second tape detection sensor S2, and the detection result is transmitted to the tape conveying control unit 26 (refer to FIG. 3). The tape conveying control unit 26 controls the first tape conveying mechanism 20A and the second tape conveying mechanism 20B based on the interval control pattern which is set in advance.

Figure 8A:
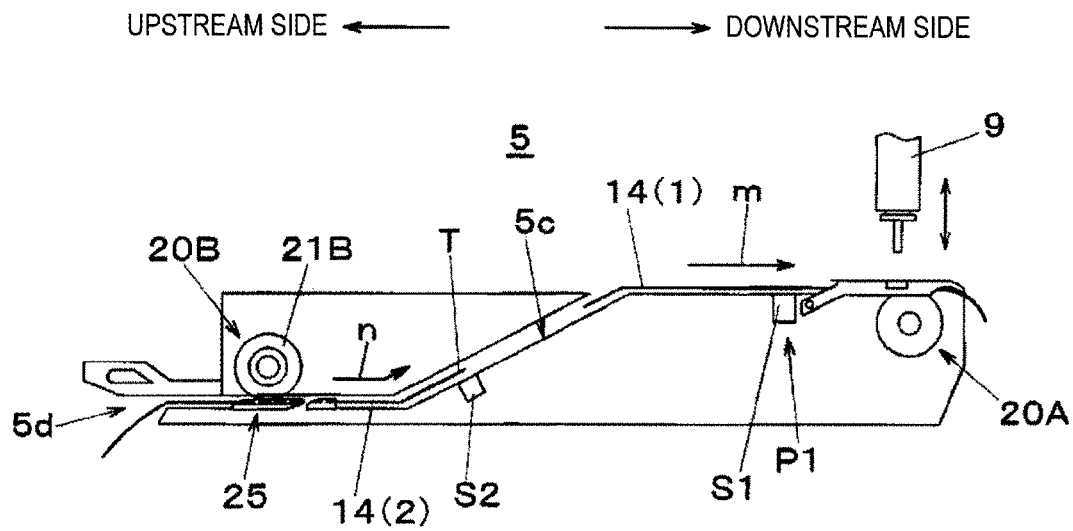
FIGS. 8(a), 8(b) and 8(c) are illustrative figures of steps of the tape conveying method which is performed by the tape feeder according to the embodiment of the present invention.
Figure 8B:
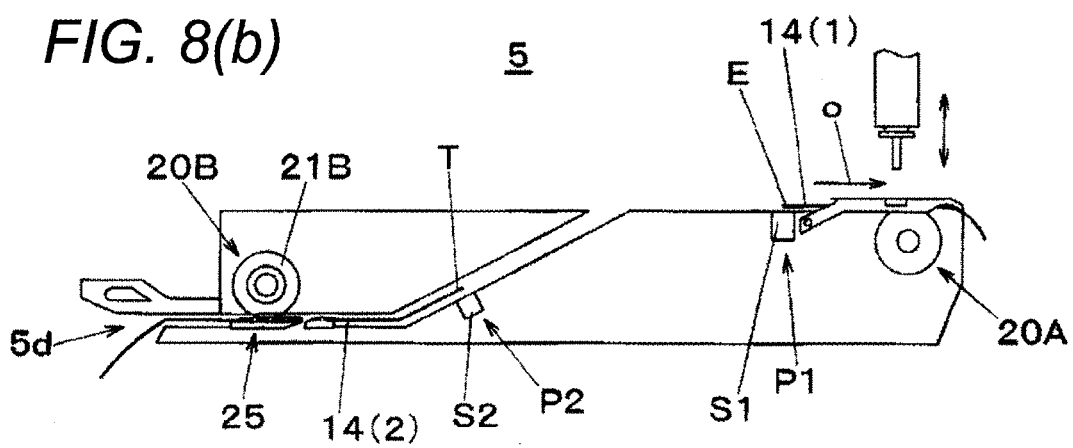
Figure 8C:
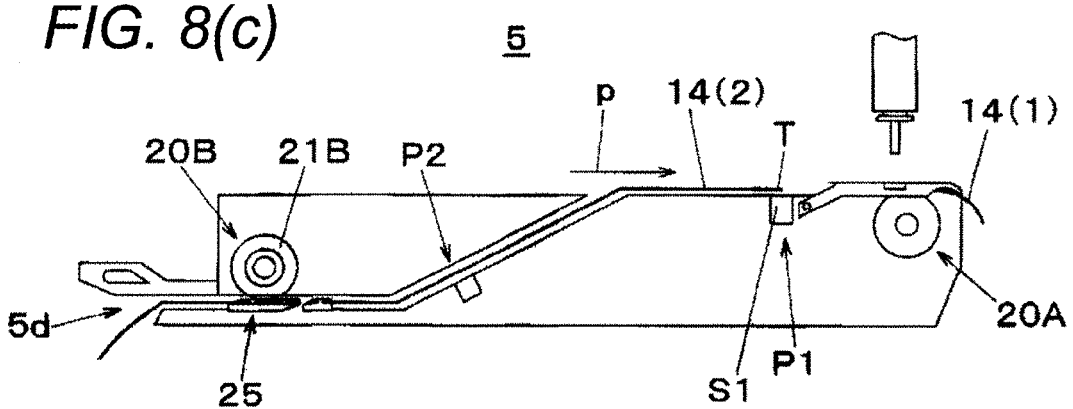

That is, as shown in FIG. 8(a), after the trailing end E of the preceding tape 14(1) is detected by the second tape detection sensor S2, in order to move the leading end T of the subsequent tape 14(2) to the second detecting position P2, by driving the second tape conveying mechanism 20B, the subsequent tape 14(2) is conveyed (arrow n), and then waits at the position. In this state, the preceding tape 14(1) is continually conveyed by the first tape conveying mechanism 20A, and the electronic components are continually taken out by the mounting head 9.

Furthermore, in the process that the preceding tape 14(1) is conveyed by the first tape conveying mechanism 20A, as shown in FIG. 8(*b*), if the trailing end E of the preceding tape 14(1) is detected by the first tape detection sensor S1, as shown in FIG. 8(*c*), by driving the second tape conveying mechanism 20B, the subsequent tape 14(2) is conveyed (arrow p) in order to move the leading end T of the subsequent tape 14(2) from the second detecting position P2 to the first detecting position P1.

As described above, in the tape feeder shown in the present embodiment, the second tape conveying mechanism 20B, which conveys the carrier tape 14 introduced from the tape introducing port 5*d* to the downstream side, has the sprocket 21B which rotates to convey the carrier tape 14 while engaging the carrier tape 14 and which may idly rotate only in the first rotating direction corresponding to the tape conveying direction, the first urging mechanism which urges the carrier tape 14 to the outer periphery of the sprocket 21B to cause the sprocket 21B to engage the carrier tape 14, and the tape stopper 35*a* which, in the two carrier tapes 14 conveyed in tandem, abuts against the leading end of the subsequent tape 14(2) to prohibit the entry of the subsequent tape 14(2), while the tape 14(1) engages the sprocket 21B and the subsequent tape 14(2) is inserted between the sprocket 21B and the preceding tape 14(1), and is so constructed that after the trailing end of the preceding tape 14(1) passes the tape stopper 35*a*, the position of the tape stopper 35*a* is changed from the tape entry prohibition position to the tape entry permission position.

Thereby, it is possible that while the preceding tape 14(1) engages the sprocket 21B, the leading end of the subsequent tape 14(2) is inserted between the sprocket 21B and the preceding tape 14(1), and the preceding tape 14(1) is urged by the first urging mechanism to cause the subsequent tape 14(2) to engage the sprocket 21B, Further, even if the thickness of the subsequent tape 14(1) is somewhat different from the thickness of the preceding tape 14(2) because of the variation of the tape thickness, it is possible that the preceding tape 14(1) passes the tape stopper 35*a* and the second urging member 31 without any interference while the subsequent tape 14(2) is certainly stopped. Therefore, with the splicingless method, even if the thickness of the preceding tape 14(1) is different from that of the subsequent tape 14(2), the subsequent tape 14(2) can be prevented from falling off to the upstream side, and can be stably set.

In the above embodiment, as a stopper mechanism which stops the subsequent tape 14(2), the stopper unit 35 is adopted which is so constructed that the tape stopper 35*a* is moved upward/downward with the upward/downward movement of the second urging member 31, but the present invention is not limited to the construction. That is, as long as there is a tape stopper which abuts against the leading end of the subsequent tape 14(2) to prohibit the entry of the subsequent tape 14(2), and the position of the tape stopper is changed from the tape entry prohibition position to the tape entry permission position after the trailing end of the preceding tape 14(1) passes the tape stopper, it is possible to adopt various stopper mechanisms.

For example, the tape stopper may be so disposed that the tape stopper can be moved upward/downward by a stopper driving mechanism at the tape stop position at the downstream side of the first urging member 30, and the position of the tape stopper can be changed when the trailing end of the preceding tape 14(1) is detected by the tape detection sensor at a predetermined position (for example, the first detecting position P1).

This application is based on the Japanese patent application (patent application 2012-199151) filed on Sep. 11, 2012, the entire contents of which are incorporated herein by reference.

INDUSTRIAL APPLICABILITY

The tape feeder and the tape setting method in the present invention has such an effect that even if the thickness of a preceding tape is different from that of a subsequent tape, the subsequent carrier tape can be stably set in the splicingless method, and are useful in the component mounting field in which electronic components are taken out and mounted on boards.

DESCRIPTION OF REFERENCE SIGNS

1: Component Mounting Device
3: Board
4: Component Supply Unit
5: Tape Feeder
5*a*: Body Portion
5*c*: Tape Path
5*d*: Tape Introducing Port
9: Mounting Head
10: Component Mounting Mechanism
14: Carrier Tape
14(1): Preceding Tape
14(2): Subsequent Tape
20A: First Tape Conveying Mechanism
20B: Second Tape Conveying Mechanism
21A, 21B: Sprocket
21*a*: Conveying Pin
22A, 22B: Motor
24: Clutch Mechanism
25: Urging Mechanism
26: Tape Conveying Control Unit
29: Connecting Gear
30: First Urging Member
31: Second Urging Member
35: Stopper Unit
35*a*: Tape Stopper
37: Lifting Member
S1: First Tape Detection Sensor
S2: Second Tape Detection Sensor
P1: First Detecting Position
P2: Second Detecting Position

The invention claimed is:

1. A tape feeder which is attached to a component mounting device and which supplies an electronic component to a component absorbing position of a mounting head, by pitch-conveying a carrier tape storing the electronic component in a tape conveying direction, said tape feeder comprising:
a tape path which leads from a tape introducing port opened at an upstream end in the tape conveying direction to the component absorbing position, and which guides a tape conveyance of the carrier tape;
a first tape conveying mechanism which is provided at a downstream side of the tape path, and which pitch-conveys the carrier tape to the component absorbing position; and
a second tape conveying mechanism which is provided at an upstream side of the tape path, and which conveys the carrier tape introduced from the tape introducing port toward the downstream side, wherein the second tape conveying mechanism comprises:

a sprocket which conveys the carrier tape by rotating in a state in which the sprocket engages the carrier tape fitting a plurality of conveying pins provided at an outer periphery of the sprocket into conveying holes of the carrier tape;

a first urging mechanism which allows an abutting surface of an urging member to contact the carrier tape and presses the carrier tape to urge the carrier tape to from a surface opposite to a component storing surface to the outer periphery of the sprocket, whereby the conveying pins engage the conveying holes; and a tape stopper which when a preceding tape to be carried precedingly of two carrier tapes to be carried precedingly and subsequently conveyed engages the sprocket and a subsequent tape to be subsequently carried is inserted between the sprocket and the preceding tape, abuts against a leading end of the subsequent tape to prohibit entry of the subsequent tape, and wherein after a trailing end of the preceding tape passes the tape stopper, a position of the tape stopper is changed from a tape entry prohibition position at which the entry of the subsequent tape is prohibited to a tape entry permission position at which the entry of the subsequent tape is permitted.

2. The tape feeder according to claim 1, further comprising:

a second urging mechanism which is provided at a downstream side of the preceding tape in the tape conveying direction and which urges the preceding tape from below to hold the preceding tape, wherein when the second urging mechanism moves upward after the trailing end of the preceding tape passes the second urging mechanism, the tape stopper is moved in association with movement of the second urging mechanism such that the position of the tape stopper is changed from the tape entry prohibition position to the tape entry permission position.

3. The tape feeder according to claim 2, wherein the second urging mechanism comprises a lifting member which lifts the tape stopper from below, and wherein when the second urging mechanism moves upward, the position of the tape stopper is changed by the lifting member from the tape entry prohibition position to the tape entry permission position.

* * * * *